(12) United States Patent
Bhushan et al.

(10) Patent No.: US 6,798,261 B1
(45) Date of Patent: Sep. 28, 2004

(54) METHOD AND APPARATUS FOR CHARACTERIZING SWITCHING HISTORY IMPACT

(75) Inventors: Manjul Bhushan, Hopewell Junction, NY (US); Mark B. Ketchen, Hadley, MA (US); Dale J. Pearson, Bedford Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/443,515

(22) Filed: May 22, 2003

(51) Int. Cl.$^7$ .............................................. H03K 3/017
(52) U.S. Cl. ...................................... 327/172; 327/176
(58) Field of Search ................................ 327/172, 173, 327/174, 175, 176, 31, 35

(56) References Cited

U.S. PATENT DOCUMENTS 6,504,409 B1 * 1/2003 Laletin ........................ 327/175
6,617,898 B2 * 9/2003 Okuno et al. ................ 327/172

* cited by examiner

Primary Examiner—Linh M. Nguyen
(74) Attorney, Agent, or Firm—Stephen C. Kaufman; Ryan, Mason & Lewis, LLP

(57) ABSTRACT

A method for characterizing a change in delay induced by a switching history of a circuit includes the steps of generating a first signal having a pulse width that is selectively adjustable, the first signal having a first edge and a second edge associated therewith, the first and second edges being opposite in polarity with respect to one another; generating a second signal having a first switch delay characteristic of the first edge of the first signal and a second switch delay characteristic of the second edge of the first signal, wherein the pulse width of the first signal is less than the first switch delay associated with the second signal; varying the pulse width of the first signal; monitoring the second signal; determining a value of the pulse width that defines a boundary of when the second signal is present and when the second signal is not present; and determining a ratio of the value of the pulse width that defines the boundary to the first switch delay and/or the second switch delay, whereby the change in delay induced by the switching history of the circuit to be characterized is a function of the ratio.

27 Claims, 3 Drawing Sheets

SOI HISTORY(%) = M/N *100 WHEN Wo = 0

METHOD AND APPARATUS FOR CHARACTERIZING SWITCHING HISTORY IMPACT

FIELD OF THE INVENTION

The present invention relates generally to circuit characterization, and more particularly relates to techniques for characterizing an impact on delay induced by the switching history of a circuit.

BACKGROUND OF THE INVENTION

In circuits fabricated using a partially depleted silicon-on-insulator (SOI) process, circuit delay is typically a function of the switching history of the circuits. For example, a complementary metal-oxide-semiconductor (CMOS) SOI circuit when switched after remaining idle for a relatively long period of time (e.g., a few milliseconds), referred to as a first switch (1SW), will typically have a longer or shorter delay than if the circuit switches again, referred to as a second switch (2SW), within a relatively short period of time (e.g., a few nanoseconds). This effect, often referred to as SOI history, can be a critical factor in determining the worst and best case performance of an SOI circuit. SOI history is generally determined as a tradeoff among the effects of drain-to-body and source-to-body leakage currents (long time constants) and very rapid dynamic capacitive coupling effects in a device. The presence of gate-to-body tunneling can be an additional factor.

Conventionally, experiments performed to evaluate SOI history effects are primarily delay chain experiments, in which steady state delays are measured and compared with delays for different input patterns. The measurement of SOI history generally involves input pulse widths on the order of a few nanoseconds (ns) and a picosecond (ps) time resolution. Such history measurements, however, have not agreed particularly well with model predictions. Furthermore, the history measurements, and delay measurements obtained therefrom, are typically performed on limited hardware using costly high-speed probing techniques and equipment, and require significant test time. These measurements, however, are difficult to obtain during processing in a manufacturing environment due, at least in part, to such problems as, for example, noise, shielding, test time, etc.

Experiments have shown that the SOI history may be as high as thirty percent in present CMOS technology, and such SOI history is significantly dependent on device design. Moreover, SOI history variation across a wafer may be in excess of five percent, and the effects of intrinsic parameter variations on SOI history is not well understood due, in part, to a limited amount of data collected.

There exists a need, therefore, for a methodology for accurately measuring SOI history that does not suffer from the problems present in conventional testing methods, some of which were described above.

SUMMARY OF THE INVENTION

The present invention provides techniques for accurately characterizing the change in delay induced by the switching history, which may be defined as a difference between the first switch delay and the second switch delay, of a circuit or device.

In accordance with one embodiment of the invention, apparatus for characterizing an impact on delay induced by the switching history of a circuit includes a pulse generator configurable for generating a signal having a pulse width that is selectively adjustable, the signal having a first edge and a second edge associated therewith, the first and second edges being opposite in polarity with respect to one another. The apparatus also includes a first delay circuit coupled to the pulse generator, the first delay circuit being configurable for receiving the signal from the pulse generator and generating a version of the signal at an output of the first delay circuit, the first delay circuit having a first switch delay characteristic of the first edge of the received signal and a second switch delay characteristic of the second edge of the received signal, wherein the pulse width of the signal generated by the pulse generator is less than the first switch delay associated with the first delay circuit.

The apparatus further includes a controller, operative to: (i) vary the pulse width of the signal generated by the pulse generator; (ii) monitor the version of the signal at the output of the first delay circuit; (iii) determine a value of the pulse width that defines a boundary of when the version of the signal is present at the output of the first delay circuit and when the version of the signal is not present; and (iv) determine a ratio of the value of the pulse width that defines the boundary to the first switch delay and/or the second switch delay, whereby the impact on delay induced by the switching history of the circuit to be characterized is a function of the ratio.

In accordance with another embodiment of the invention, a method for characterizing a change in delay induced by a switching history of a circuit includes the steps of: generating a signal having a pulse width that is selectively adjustable, the signal having a first edge and a second edge associated therewith, the first and second edges being opposite in polarity with respect to one another; generating a delayed version of the signal, the delayed version of the signal having a first switch delay characteristic of the first edge of the signal and a second switch delay characteristic of the second edge of the signal, wherein the pulse width of the signal is less than the first switch delay associated with the delayed version of the signal; varying the pulse width of the signal; monitoring the delayed version of the signal; determining a value of the pulse width that defines a boundary of when the delayed version of the signal is present and when the delayed version of the signal is not present; and determining a ratio of the value of the pulse width that defines the boundary to the first switch delay and/or the second switch delay, whereby the change in delay induced by the switching history of the circuit to be characterized is a function of the ratio.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be described herein with reference to circuits that are fabricated using a partially depleted silicon-on-insulator (SOI) process. As previously stated, characterizing SOI devices and circuits is particularly difficult due, at least in part, to a body potential which may vary as a function of switching history. This body potential is created in part as a result of the floating body which is present in the SOI circuit. In order to properly characterize an SOI device or circuit, therefore, it is important to obtain an accurate measurement of the SOI history of the device or circuit. It is to be appreciated, however, that the techniques of the present invention are not limited to SOI circuits. Rather, the techniques of the invention may be similarly used to more accurately characterize devices and circuits formed using alternative fabrication processes, such as, but not limited to, a conventional bulk CMOS process.

Figure 1:
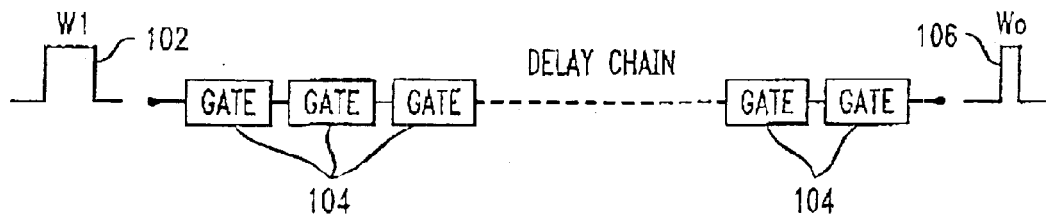
FIG. 1 is a schematic diagram illustrating the propagation of an input pulse through a delay chain for two particular cases.
Figure 1:
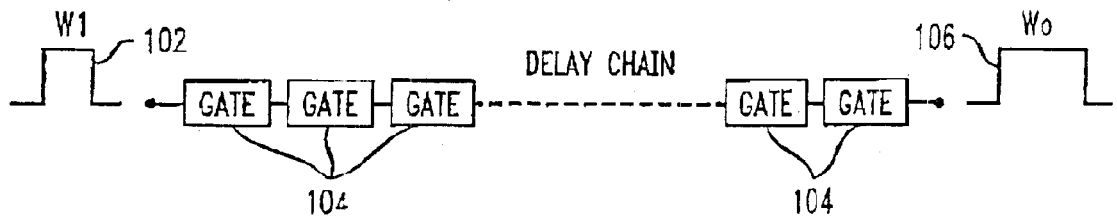

In accordance with one aspect of the invention, an exemplary SOI history measurement methodology is described, referred to herein as direct current (DC) variable history monitor (DCVHS), which first makes use of the fact that the width of a pulse propagating down a chain of SOI devices will typically shrink or expand depending on the relative first switch and second switch delays. FIG. 1 illustrates this principle for an input pulse 102 having a pulse width WI propagating through a plurality of SOI gates 104 connected in a series chain for two particular cases, namely, Case 1 and Case 2. In Case 1, the first switch delay is greater than the second switch delay, and therefore the output pulse 106 has a pulse width Wo that is smaller than the input pulse width W1. In Case 2, the first switch delay is less than the second switch delay, and therefore the output pulse width Wo is greater than the input pulse width W1.

For Case 1, wherein second switch delay is faster than first switch delay, which is typically more common for SOI technologies under normal operating conditions, the output pulse 106 will vanish when the width of the input pulse 102 is decreased below some critical width. The first switch delay t(1SW) of the entire delay chain comprising SOI gates 104 can be expressed as $$t(1SW) = N \times D(1SW) \quad (1)$$

where N is the number of gates 104 in the delay chain and D(1SW) is the average first switch delay of a gate 104 in the delay chain. The delay D of a particular gate may be determined as an average of pullup delay (PU) and pulldown delay (PD). Thus, the first switch delay D(1SW) may be expressed as $$D(1SW) = \frac{PU(1SW) + PD(1SW)}{2} \quad (2)$$

The 1SW/2SW SOI history H, which may be represented as a percentage change in delay between first switch and second switch, can be expressed as $$H(\%) = \frac{N[D(1SW) - D(2SW)]}{N[D(1SW)]} \times 100 \quad (3)$$

As the width W1 of the input pulse 102 is reduced, the output pulse 106 from the delay chain eventually vanishes when W1 is equal to N[D(1SW)−D(2SW)].

Figure 2:
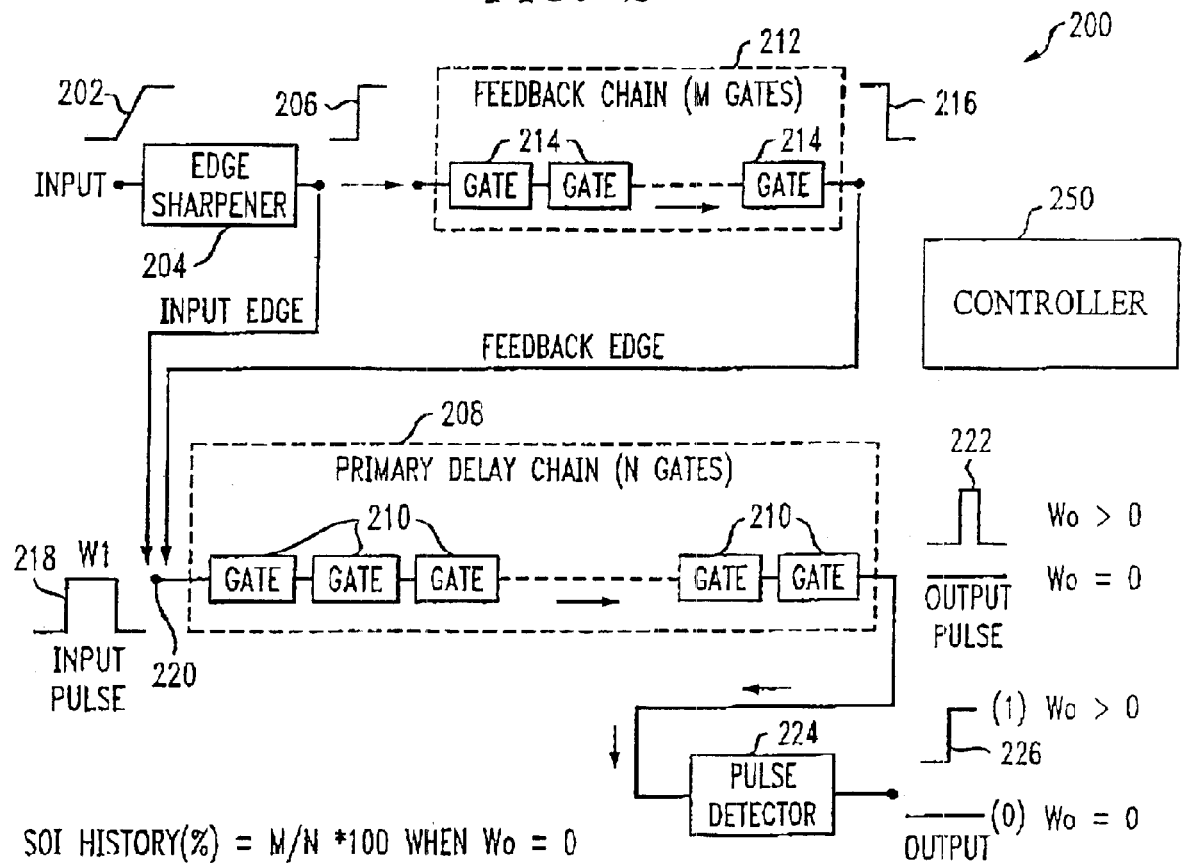
FIG. 2 is a graphical illustration depicting at least a portion of an exemplary circuit for characterizing SOI history, in accordance with one embodiment of the present invention.

FIG. 2 illustrates an exemplary DCVHS circuit 200 in which the techniques of the present invention may be implemented. It is to be appreciated, however, that the present invention is not limited to the precise embodiment shown herein.

Using the DCVHS methodology of the present invention, an input pulse of width W1 can be precisely generated from a single sharp input edge arriving at an arbitrary time. As apparent from the figure, the initial sharp edge, which may be referred to herein as an input edge 206, can be generated by passing a signal 202 through an edge sharpener circuit 204. The edge sharpener circuit 204 may comprise, for example, a logic gate or alternative circuitry (e.g., a latch) for providing an edge having a relatively fast rise or fall time (e.g., on the order of about 20 ps or less). Signal 202 may be a significantly slow changing signal (e.g., having a period of several milliseconds or more) and may, in fact, be substantially close to direct current (DC), as long as the signal exhibits a recognizable change in amplitude from logic zero to logic one, or vice versa, during some time interval. Signal 202 need not be a monotonic signal. Although the input edge 206 is depicted as a rising edge, it is to be understood that a falling edge may be similarly used. The edge sharpener 204 is configured to launch only a single edge during any given operation cycle.

The input edge 206 is introduced at an input 220 of a primary delay circuit 208, comprising N SOI gates 210 connected in a series chain, and simultaneously introduced at an input of a feedback delay circuit 212, comprising M SOI gates 214 also connected in a series chain, where N and M are both non-zero integers and M is less than or equal to N. Subsequently, a second edge 216, which may be referred to herein as a feedback edge and being opposite in polarity (e.g., falling edge) to the input edge, generated at an output of the M-gate feedback delay circuit 212 is fed to the input 220 of the primary delay circuit 208. The input 220 of the primary delay circuit 208 essentially functions as a signal accumulator, whereby the input edge 206 and the feedback edge 216 are operatively summed together to form an input pulse 218 of width W1 which propagates through the primary delay circuit 208.

The pulse width W1 of the input pulse 218 will be equal to M×D(1SW), where D(1SW) is defined by equation (2) above. An output pulse 222 will be generated at an output of the primary delay circuit 208 as long as the input pulse 218 is greater than or equal to a certain minimum width. As the width W1 of the input pulse 218 is reduced, the output pulse 222 from the primary delay chain 208 will vanish when W1 is equal to N[D(1SW)−D(2SW)], as previously stated. It follows, therefore, by substituting the expression for W1 into equation (3) above, assuming that the gates 210 in the primary delay chain are substantially the same as the gates 214 in the feedback delay chain, that the output pulse vanishes for $$M/N = H(\%)/100 \quad (4)$$

The feedback delay circuit 212 is preferably configurable such that the output of one or more interconnected gates 214 in the chain are selectively accessible, for example, similar to a tapped delay line. In a tapped delay line, as is well known by those skilled in the art, one or more outputs (i.e., taps) in a delay chain may be selectively accessed, such as, for example, with a multiplexer operatively connected thereto. Since each of the gates 214 in the feedback delay circuit 212 are preferably substantially matched to one another, the first switch and second switch delays associated with the gates 214 will be substantially the same. Assuming the outputs (taps) of at least a subset of gates 214 in the feedback delay circuit 212 are accessible, the first switch delay at any particular tap k in the chain will be k×m×D (1SW), where m represents step size, defined as the number of gates between two consecutive taps (e.g., k and k+1). The delay at a given tap k will be more than the delay at a previous tap (e.g., k−1) in the delay chain.

By way of example only, consider a feedback delay chain comprising 100 gates (i.e., M=100) and having an output tap every 20 gates in the chain. Thus, each tap k in the feedback delay chain (k=1, 2, 3, 4, or 5) will have a step size of m=20. Using the expression set forth above, the first switch delay at tap k=2 in the feedback delay chain can be determined as 2×20×D(1SW), the first switch delay at a third tap k=3 will be 3×20×D(1SW), etc., yielding an overall first switch delay of M×D(1SW), at the output of the feedback delay circuit 212.

The exemplary DCVHS circuit 200 preferably includes multiple feedback chains, each of the feedback chains having a different time delay (i.e., length) associated therewith. By selecting which one of the taps is fed back to the input 220 of the primary delay circuit 208, the pulse width W1 of the input pulse 218 can be selectively controlled. The minimum resolution with which the pulse width of the input pulse 218 may be varied will essentially be limited by the delay of a single gate 214 in the feedback delay circuit 212.

The exemplary DCVHS circuit 200 of the present invention further includes a pulse detector 224 or alternative circuitry for indicating the presence or absence of an output pulse 222 appearing at the output of the primary delay circuit 208. Preferably, the pulse detector 224 comprises a latch circuit, or alternative circuitry, which is configurable for generating a DC logic signal 226 at an output of the pulse detector 224, for example, a logic one ("1") or zero ("0"), representing either the presence or absence, respectively, of the output pulse 222. An important benefit of the present invention is that since the input signal 202 can be very low in frequency (essentially "DC") and the output signal 226 can be DC, the timing burden placed on measurement equipment utilized to characterize the SOI history of a given device or circuit under test can be significantly reduced.

It is to be appreciated that, although the feedback delay circuit 212 and the primary delay circuit 208 are shown as a separate circuit blocks for ease of explanation, the invention contemplates that the primary delay circuit 208 may, in fact, comprise at least a portion of the feedback delay circuit 212. In such embodiment, the feedback delay chain may share one or more gates 210 in the primary delay chain. In a manner consistent with the feedback delay circuit 212, the outputs of one or more gates 210 in the primary delay circuit 208 may be selectively accessible, for example, as a tapped delay line, for selectively controlling the width of the input pulse to the primary delay circuit.

An important aspect of the exemplary DCVHS circuit 200 of the present invention is that it can be self-calibrating. This is due, at least in part, to the fact that the gates 214 comprised in the feedback delay circuit 212 can be substantially matched to the gates 210 comprised in the primary delay circuit 208. In fact, as previously explained, the primary delay circuit may comprise the feedback delay chain. Thus, the delay of each output in the feedback chain is scaled with respect to the delay of the primary delay circuit. Furthermore, the exemplary DCVHS circuit 200 is self-timed, since the timing of the falling edge of the input pulse 218 relative to the rising edge of the input pulse is precisely determined by one of the internal feedback paths, the absolute timing of the initial input edge 202 being unimportant.

In accordance with one embodiment of the invention, a number of feedback paths (steps) are provided in the DCVHS circuit 200, one of which is selected at a given time. For example, assuming the total number of gates in the feedback delay circuit 212 is M=km, where m may be defined as the number of gates 214 in each step (i.e., step size) and k may be defined as a particular step (e.g., k=1, 2, 3, 4, 5, 6, 7, 8), as previously explained, then the history resolution, in percent, may be determined as (m/N)×100. The feedback paths can preferably be sequentially addressed from 1 to 8, or in any other combination desired. For example, for a large number of steps k, an algorithm (e.g., successive approximation) may be employed to speed the step selection process. By sequentially addressing the feedback paths, the outputs corresponding to the particular feedback paths selected will comprise a set of logic zeros (0's) followed by a set of logic ones (1's). The value of k, representing a given feedback path, at which the first 1 appears defines the history. For example, if the first 1 appears for k=5, then the history is somewhere in the range of [4 to 5]×[(m/N)×100].

The exemplary DCVHS circuit 200 may further include a controller 250 which can be used to vary the pulse width W1 of the input pulse 218 presented to the primary delay circuit 208. Additionally, the controller 250 may be used to monitor the output pulse 222 generated by the primary delay circuit 208 to determine a value of the pulse width W1 of input pulse 218 that defines There are a number of methodologies which may be used in implementing the techniques of the present invention. Some of these methodologies will be described in further detail herein below in connection with FIGS. 2 through 6. However, it is to be understood that the techniques of the present invention are not limited to the precise embodiments shown, and that other variations of the fundamental idea, as may be made by those skilled in the art, are contemplated by and fall within the scope of the present invention.

For Case 1, wherein the first switch delay is greater than the second switch delay, the exemplary DCVHS circuit 200 illustrated in FIG. 2 may be employed. As previously explained, the length of the feedback chain comprising gates 214 in the feedback delay circuit 212 is selectively variable and the primary delay chain comprising gates 210 in the primary delay circuit 208 is fixed. This may be accomplished, in a preferred embodiment of the invention, by providing multiple feedback delay chains (i.e., feedback paths) of different length, and thus of different delay. A decoder (not shown), or alternative switching circuitry, operatively coupled to the feedback delay circuit may be used to select which feedback chain is active at any given time.

In accordance with an alternative embodiment of the present invention, the M-gate feedback delay chain may be implemented by M gates (e.g., the first M gates) in the primary delay chain. The first switch signal is preferably tapped off M gates down the primary delay chain and routed back to the input 220 of the primary delay circuit to launch the second switch edge (2SW). In this arrangement, a latch or alternative circuitry (not shown) is preferably used in insure that only a single secondary edge is launched per test cycle.

In accordance with another alternative embodiment of the invention, the feedback chain length is kept fixed at M gates. Instead of keeping the primary delay chain length fixed, the primary delay chain is tapped along its length. The output of the primary delay circuit may be read, for example, using a multiplexer or alternative switching circuitry (not shown), thus effectively varying the primary delay chain length.

Figure 3:
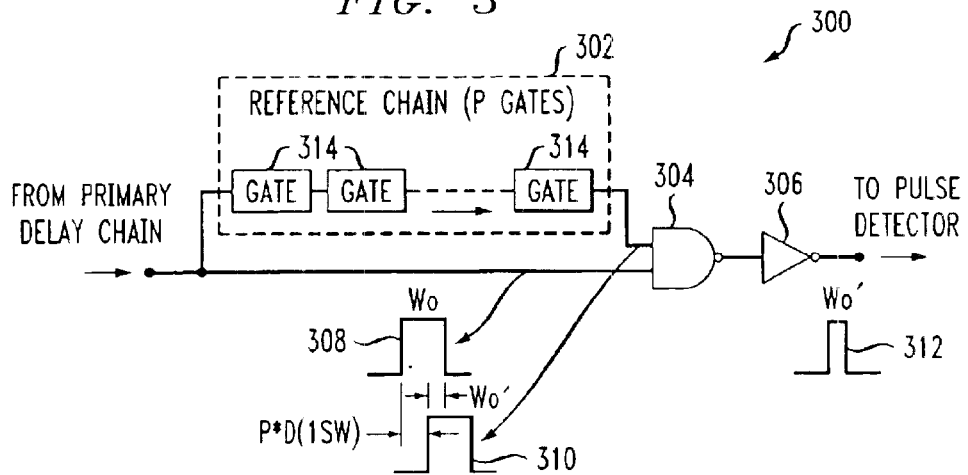
FIG. 3 is a schematic diagram illustrating an exemplary zero offset adjust circuit which may be used in conjunction with the circuit shown in FIG. 2, in accordance with the present invention.

For Case 2, wherein the first switch delay is less than the second switch delay, the exemplary DCVHS circuit 200 shown in FIG. 2 may be employed in conjunction with a zero offset adjust circuit (not shown) coupled between the output of the primary delay circuit 208 and the input of the pulse detector 224. FIG. 3 illustrates an exemplary zero offset adjust circuit 300, formed in accordance with one embodiment of the present invention. It is to be appreciated, however, that the present invention is not limited to the precise circuit arrangement shown.

With reference to FIG. 3, the exemplary zero offset adjust circuit 300 comprises a reference delay circuit 302 including a plurality (P) of gates 314 connected in a series chain, for example, in a manner consistent with the feedback and primary delay circuits previously described. The output pulse 308 of width Wo (pulse 222 in FIG. 2), generated at the output of the primary delay circuit 208, is compared with a similar pulse 310 generated at an output of the reference delay circuit 302, with a leading edge delayed in time with respect to that of the primary output pulse by an amount P×D(1SW), where P is the number of gates 314 in the reference delay circuit 302 and D(1SW) is the average delay of a single gate 314. When both pulses 308, 310 overlap (e.g., are simultaneously a logic 1), a pulse 312 of width Wo' is generated at an output of the zero offset adjust circuit 300 and fed to the input of the pulse detector 224 shown in FIG. 2.

The above comparison operation may be accomplished, for example, by feeding the pulse 308 to an input of the reference delay circuit 302 and simultaneously to a first input of a NAND gate 304. The delayed pulse 310 from the reference delay circuit 302 is then fed to a second input of the NAND gate 304. The NAND gate 304 effectively sums the pulse 308 from the primary delay circuit 208 with the delayed version of the pulse 310 from the reference delay circuit 302 and generates an output pulse, through an inverter 306 coupled to the NAND gate 304, having a width corresponding to an amount of overlap between the two pulses 308, 310.

A condition which defines the boundary between overlap and non-overlap of pulses 308, 310 may be expressed as $Wo = D(1SW) \times P$, or $$D(1SW) \times M - [D(1SW) - D(2SW)] \times N = D(1SW) \times P \quad (5)$$

Dividing both sides of the above equation by $D(1SW) \times N$ and referring to equation (3) above for the SOI history yields the expression $$H(\%) = \frac{M - P}{N} \times 100 \quad (6)$$

As equation (6) above demonstrates, using the techniques of the present invention, SOI history may be easily determined as a function of the number of gates in the feedback delay circuit, the number of gates in the reference delay circuit and the number of gates in the primary delay circuit.

The length of the feedback delay chain (M) or the reference delay chain (P) can be varied in increments of q/N to obtain a history resolution in percentage of (q/N)×100, where q may be defined as the number of gates in each step (i.e., step size) associated with the reference delay chain and/or the feedback delay chain. When the quantity (M−P) is negative at the boundary between overlap and non-overlap, the history H is negative corresponding to Case 2, wherein the second switch delay is greater than the first switch delay. Likewise, when the quantity (M−P) is positive at the boundary, the history H is positive corresponding to Case 1, wherein the first switch delay is greater than the second switch delay. An important benefit of the methodology of the present invention is that a single experimental design can be used over a range of both positive and negative values of history.

The zero offset adjust circuit 300 may be utilized in conjunction with an alternative embodiment of the invention in which the length of the feedback delay chain (M) and the length of the reference delay chain (P) are fixed and the primary delay chain is tapped along its length. As previously explained, the output of the primary delay circuit may be read using, for example, a multiplexer or alternative switching circuitry, thereby effectively varying the primary delay chain length (N), as will be understood by those skilled in the art.

Figure 4:
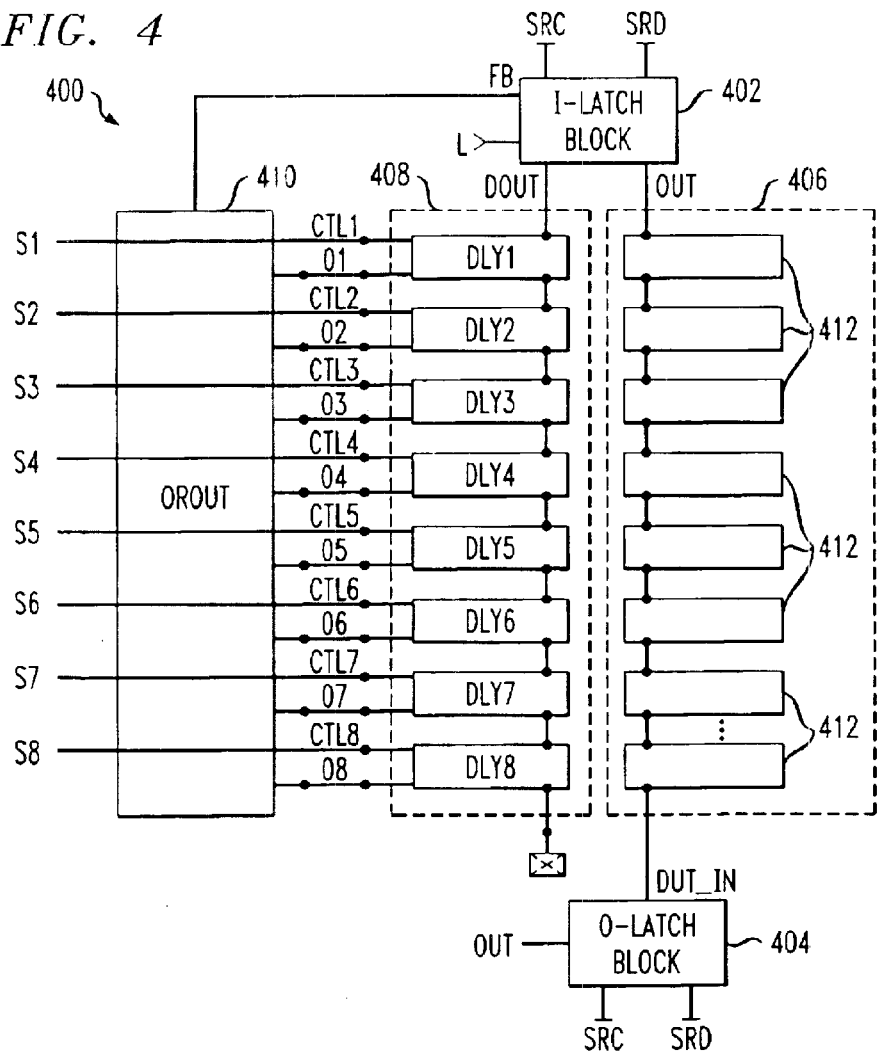
FIG. 4 is a top level schematic diagram illustrating at least a portion of an exemplary SOI history characterization circuit, formed in accordance with one embodiment of the present invention.

FIG. 4 is a top level schematic illustrating an exemplary SOI history characterization circuit 400 which may be used to implement the techniques of the present invention described herein. As apparent from the figure, the exemplary SOI history characterization circuit 400 comprises an input latch circuit 402, an output latch circuit 404, a primary delay circuit 406, a feedback delay circuit 408 and a decoder 410. In the exemplary circuit 400, three signals, namely, L, SRC and SRD, are preferably used to initiate (i.e., launch) the pulse, and to set/reset the clock and data inputs to the latches, respectively.

As previously explained, the primary delay circuit 406 includes a fixed number of delay blocks 412 connected together in a series configuration to form a primary delay chain. Each delay block 412 is preferably configurable as a delay element for generating a delayed version of an input signal presented thereto and may comprise a single gate or an alternative delay circuit. In the exemplary circuit 400, the length of the primary delay circuit 406 is fixed, although the invention contemplates that the primary delay circuit 406 may alternatively comprise a tapped delay chain, as previously stated.

The feedback delay circuit 408 includes a fixed number of delay blocks, namely, DLY1, DLY2, DLY3, DLY4, DLY5, DLY6, DLY7 and DLY8 connected together in a series configuration to form a feedback delay chain, in a manner consistent with the formation of the primary delay circuit 406. However, unlike the primary delay circuit 406 which is fixed in length, the feedback delay circuit 408 is configured to have selectable lengths, thus functioning as a tapped delay line. To accomplish this, each of the delay blocks DLY1 through DLY8 may include a control input CTL1 through CTL8, respectively, for selectively connecting a corresponding output (i.e., tap) O1 through O8 of the delay block to a respective input of an OR circuit 410. Since the feedback delay chain in the exemplary circuit 400 includes eight delay blocks, a controller (not shown), which may comprise, for example, a three-bit decoder, can be used to generate the control signals S1 through S8 for controlling which output (tap) in the feedback delay chain is fed back to an input of the primary delay circuit 406. Additionally, the controller may be used to automatically monitor the output pulse from the primary delay circuit, determine which tap selection causes the output pulse to vanish, and determine the SOI history based, at least in part, on the above equations.

Each of the delay blocks DLY1 through DLY8 in the feedback delay circuit are preferably substantially matched to one another to provide linear and uniform incremental changes in the delay length of the feedback chain. The invention contemplates, however, that the delay blocks made also be configurable so as to allow nonlinear incremental variations in the delay chain (e.g., binary, logarithmic, etc.). Furthermore, the delay blocks in the feedback delay chain are preferably substantially matched to the delay blocks in the primary delay chain so as to beneficially provide a self-calibration and/or self-timing mechanism for the circuit 400, as previously explained. Utilizing matching delay blocks also simplifies the physical layout of the circuit 400 when implemented in an integrated circuit (IC).

It is to be understood that the present invention is not limited to the number of delay blocks in the feedback delay circuit and/or primary delay circuit, and that modifications may be made to the feedback delay block and/or corresponding control circuitry, as will be known by those skilled in the art. Furthermore, the primary delay circuit 406 may comprise at least a portion of the feedback delay circuit 408, as explained herein above.

The OR circuit 410 preferably comprises an eight-input OR gate, with each input being connected to a corresponding output tap in the feedback delay circuit 408. An output of the OR circuit 410 is connected to a feedback input FB of the input latch circuit 402. The OR circuit 410 may further include circuitry (not shown) for operatively adjusting the polarity of the signal of a given tap in the feedback delay circuit 408 when required, as will be understood by those skilled in the art.

Figure 5:
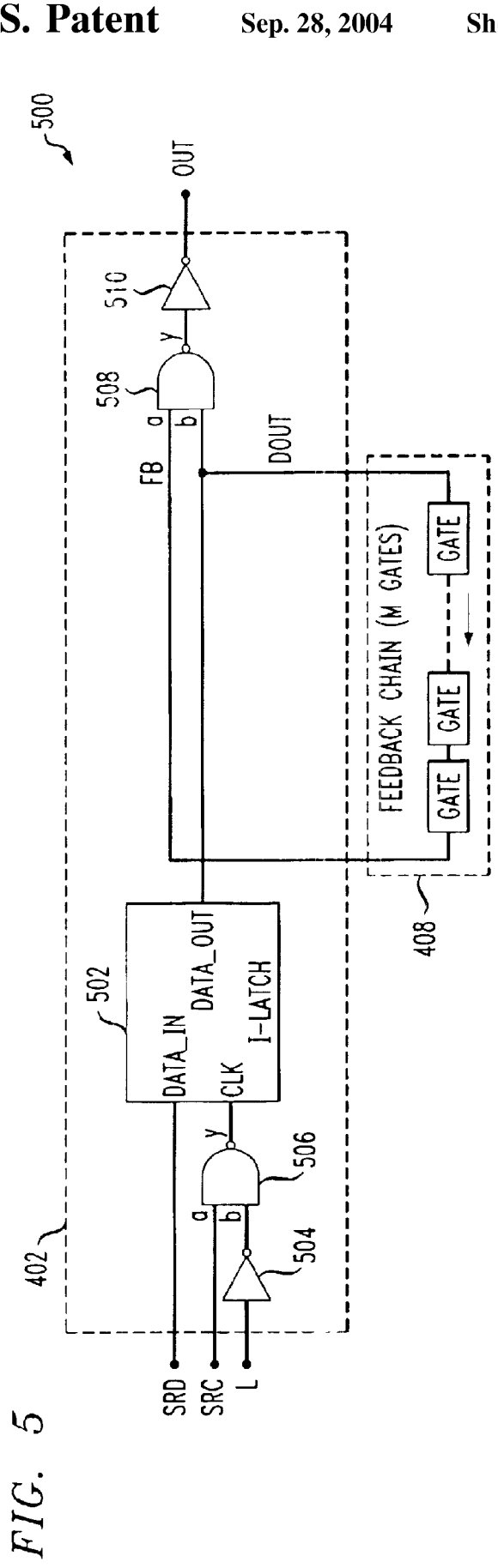
FIG. 5 is a schematic diagram illustrating at least a portion of an exemplary circuit for generating an input pulse, formed in accordance with one embodiment of the present invention.

The input latch circuit 402 generates the input pulse which propagates through the primary delay circuit 406. An exemplary input latch circuit 402 suitable for use with the present invention is shown in FIG. 5. With reference to FIG. 5, the exemplary latch circuit 402 includes a latch 502 having a clock input (clk), a data input (data_in), and an output (data_out). A conventional latch (e.g., transparent latch), as well as alternative latching circuitry, may be used to implement latch 502, as will be known by those skilled in the art.

The set/reset signal SRD is preferably coupled to the data_in input of latch 502. The signal SRD is preferably a DC logic level voltage, such as, for example, positive supply voltage VDD (i.e., logic high) or negative supply voltage VSS, which may be ground (i.e., logic low). The pulse initiate signal L provides an input edge for clocking the latch 502 which, as previously explained, may be a substantially DC signal, as long as such signal exhibits a recognizable change in logic level (e.g., logic low to logic high, or vice versa) within a given time period. Pulse initiate signal L is preferably inverted by a first inverter 504 and fed to a first input b of a first NAND gate 506. A second input a of the first NAND gate 506 is preferably coupled to the set/reset signal SRC, which may be a DC logic level voltage. An output y of the first NAND gate 506 is coupled to the clk input of the latch 502.

A logic high, as may be set with the SRD signal, will propagate through the latch 502, when signal SRC is a logic high, as signal L is switched from a logic low to a logic high. A single sharp edge will emerge at the output data_out of the latch 502 at some arbitrary time independent of the slew of signal L. The output will remain at a logic high provided signal SRD is held at a logic high, independent of subsequent changes of signal SRC and/or the signal L. At the end of an operation cycle, signals SRD and SRC may be brought to a logic low voltage, thereby resetting the latch, and signal L brought to a logic low for a subsequent operation cycle.

The output data_out of the latch 502 preferably forms an output DOUT of the input latch circuit 402 which is coupled the input of the feedback delay circuit 408. Additionally, the output of the latch 502 is coupled to a first input b of a second NAND gate 508 included in input latch circuit 402. The output of the feedback delay circuit 408 is coupled to a second input a of the second NAND gate 508. An output y of the second NAND gate 508 is preferably fed through an inverter 510 so that the output pulse generated by the input latch circuit 402 is of the correct polarity. Thus, the input latch circuit 402 generates a pulse at its output OUT having a pulse width that is a function of the feedback delay generated by the feedback delay circuit 408, as previously described. At least a portion of the input latch circuit 402 and the feedback delay circuit 408 may be integrated to form a pulse generator 500 for generating the input pulse presented to the primary delay circuit.

Figure 6:
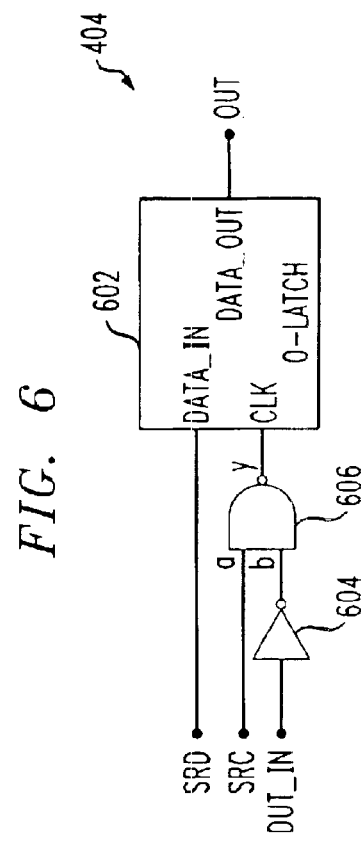
FIG. 6 is a schematic diagram illustrating at least a portion of an exemplary pulse detector circuit, formed in accordance with one embodiment of the present invention.

An exemplary output latch circuit 404 suitable for use with the present invention is shown in FIG. 6. The exemplary output latch circuit 404, which is configurable for storing an indication of the presence and/or absence of an output pulse from the primary delay circuit 406 shown in FIG. 4, preferably includes a latch 602 having a clock input (clk), a data input (data_in), and an output (data_out) which forms the output OUT of the output latch circuit 404.

Like the latch 502 in the exemplary input latch circuit 402 depicted in FIG. 5, latch 602 may be implemented by a conventional latch, as well as other latching circuitry, as will be known by those skilled in the art. The inputs to the latch 602 are connected in a manner consistent with the inputs of latch 502 in FIG. 5, except that the pulse initiate signal L shown in FIG. 5 is replaced by a signal DUT_IN generated at the output of the primary delay circuit 406.

The set/reset signal SRD is preferably coupled to the data_in input of latch 602. As previously stated, the signal SRD is preferably a DC logic level voltage, such as, for example, VDD (i.e., logic high) or VSS (i.e., logic low). The signal DUT_IN provides an input edge for clocking the latch 602. DUT_IN is preferably inverted by an inverter 604 and fed to a first input b of a NAND gate 606. A second input a of the NAND gate 606 is preferably coupled to the set/reset signal SRC which, as previously stated, may be a DC logic level voltage. An output y of the NAND gate 606 is coupled to the clk input of the latch 602. In a manner consistent with the operation of the input latch circuit 402, a logic low level on the signals SRC and SRD resets the output latch circuit 404.

A logic high, set when signal SRD is a logic high, will propagate through the latch 602 when, with signal SRC being a logic high, signal DUT_IN switches from a logic low to a logic high. A positive edge at the input of inverter 604 indicates the presence of an output pulse from the primary delay circuit 406. Conversely, a logic low at the inverter input indicates the absence of an output pulse from the primary delay circuit 406. The output OUT of the latch 602 will remain at a logic high provided signal SRD is held at a logic high, independent of subsequent changes of signal SRC and/or the signal DUT_IN. At the end of an operation cycle, signals SRD and SRC may be brought to a logic low, thereby resetting the latch to a logic low at the output OUT, and signal DUT_IN brought to a logic low for a subsequent operation cycle.

By way of example only, Table 1 below depicts an illustrative input/output bit pattern for running one cycle of DCVHS operation. The decoder bits are not shown. With reference to Table 1, when OUT is a 1 in step 5, this indicates that an output pulse from the primary delay circuit was detected. It is to be appreciated that each cycle of DCVHS operation, which includes the five steps shown, is repeated seven more times, once for each of the eight different feedback chain lengths sequentially selected in the exemplary SOI history circuit 400 (FIG. 4).

TABLE 1

| STEP | 1 | 2 | 3 | 4 | 5 |
|------|---|---|---|---|---|
| L    | 0 | 0 | 0 | 0 | 1 |
| SRD  | 1 | 0 | 0 | 1 | 1 |
| SRC  | 1 | 0 | 1 | 1 | 1 |
| OUT  | 0 | 0 | 0 | 0 | 1 |

As previously explained, assuming the number of gates in the feedback path is M=km, where k=1, 2, 3, 4, 5, 6, 7 or 8, then the SOI history resolution in percent is given by $(m/N)\times100$. By sequentially selecting feedback paths 1 through 8, an output will be obtaining comprising a set of logic zeros followed by a set of logic ones. The value of k at which the first logic one appears defines the history. Accordingly, if the first logic one appears for k=5, then the history is in the range of $[4 \text{ to } 5]\times[(m/N)\times100]$.

In order to characterize a circuit in which the second switch delay is greater than the first switch delay (Case 2), a zero offset adjust circuit, an exemplary embodiment of which is shown in FIG. 3, may be connected between the output of the primary delay circuit 406 and the input DUT_IN of the output latch circuit 404, as previously described.

The present invention has been described herein in terms of separate functional circuits and/or sub-components (e.g., feedback delay circuit, primary delay circuit, input latch circuit, etc.), at least in part for ease of explanation. However, one skilled in the art will recognize that one or more of these functional circuits and/or sub-components may be operatively combined, with or without modification. For example, at least a portion of the feedback delay circuit may be combined with the primary delay circuit, as previously stated. In this manner, certain portions of the combined circuits may be shared, thereby reducing the total number of components in the switching history characterization circuit.

It is to be appreciated that embodiments of the switching history characterization circuit described herein may be implemented in whole or in part by a semiconductor device, which may comprise one or more of such characterization circuits or portions thereof The techniques of the present invention may be used to achieve improvements over conventional history measurement methodologies.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. Apparatus for characterizing a change in delay induced by a switching history of a circuit, the apparatus comprising:
    a pulse generator configurable for generating a signal having a pulse width that is selectively adjustable, the signal having a first edge and a second edge associated therewith, the first and second edges being opposite in polarity with respect to one another;
    a first delay circuit coupled to the pulse generator, the first delay circuit being configurable for receiving the signal from the pulse generator and generating an output signal at an output of the first delay circuit, the first delay circuit having a first switch delay characteristic of the first edge of the received signal and a second switch delay characteristic of the second edge of the received signal, wherein the pulse width of the signal generated by the pulse generator is less than the first switch delay associated with the first delay circuit; and
    a controller, operative to: (i) vary the pulse width of the signal generated by the pulse generator; (ii) monitor the output signal; (iii) determine a value of the pulse width that defines a boundary of when the output signal is present and when the output signal is not present; and (iv) determine a ratio of the value of the pulse width that defines the boundary to at least one of the first switch delay and the second switch delay, whereby the change in delay induced by the switching history of the circuit to be characterized is a function of the ratio.

2. The apparatus of claim 1, wherein the pulse generator comprises an edge sharpener circuit configurable for receiving an input edge and generating the first edge of the signal, the input edge having a rate of change of amplitude associated therewith that is substantially slower than a rate of change of amplitude associated with the first edge of the signal.

3. The apparatus of claim 2, wherein the input edge received by the edge sharpener circuit is generated by a substantially direct current (DC) signal.

4. The apparatus of claim 1, wherein the pulse generator comprises a second delay circuit including a plurality of delay elements connected in a series chain, at least a portion of the delay elements being scaled to at least one of the first switch delay and the second switch delay associated with the first delay circuit, the second delay circuit including a plurality of feedback paths for operatively adjusting the pulse width of the signal.

5. The apparatus of claim 4, wherein a delay of the second edge relative to the first edge is operatively adjusted by selecting one of the plurality of feedback paths associated with the second delay circuit, the pulse width of the signal being proportional to the delay of the second edge relative to the first edge.

6. The apparatus of claim 4, wherein the second delay circuit comprises a tapped delay chain including a plurality of output taps, the pulse width of the signal being adjusted by operatively selecting one of the output taps.

7. The apparatus of claim 6, wherein the output taps are selected sequentially.

8. The apparatus of claim 6, wherein the output taps are selected using a successive approximation algorithm.

9. The apparatus of claim 4, wherein the first and second edges are operatively summed together at an output of the pulse generator to form the signal received by the first delay circuit.

10. The apparatus of claim 1, wherein the first delay circuit comprises at least a portion of the pulse generator.

11. The apparatus of claim 1, wherein the pulse generator is configurable for adjusting the pulse width of the signal in predetermined steps, the size of each of the steps being scaled to at least one of the first switch delay and the second switch delay associated with the first delay circuit.

12. The apparatus of claim 1, wherein the first delay circuit comprises a plurality of delay elements connected in a series chain.

13. The apparatus of claim 1, wherein the first delay circuit comprises the pulse generator.

14. The apparatus of claim 1, wherein the circuit to be characterized comprises at least one silicon-on-insulator circuit.

15. The apparatus of claim 1, further comprising a pulse detector coupled to the output of the first delay circuit, the pulse detector being configurable for monitoring the output signal from the first delay circuit and providing an indication of at least one of when the output signal is present at the output of the first delay circuit and when the output signal is not present at the output of the first delay circuit.

16. The apparatus of claim 15, wherein the pulse detector is configurable to at least temporarily store the indication of when the output signal is present at the output of the first delay circuit.

17. The apparatus of claim 16, wherein the pulse detector comprises a latch circuit for storing the indication of when the output signal is present at the output of the first delay circuit.

18. The apparatus of claim 1, further comprising an offset adjust circuit operatively coupled to the output of the first delay circuit, the offset adjust circuit being configurable for modifying at least a pulse width of the output signal to be monitored by the controller by generating a delayed version of the output signal from the first delay circuit, the delayed version of the output signal having a first edge and a second edge associated therewith, the modified output signal having a first edge substantially matched to the first edge of the delayed version of the output signal and having a second edge substantially matched to the second edge of the output signal from the first delay circuit.

19. The apparatus of claim 18, wherein the offset adjust circuit comprises a second delay circuit for receiving the output signal from the first delay circuit and generating the delayed version of the output signal.

20. The apparatus of claim 19, wherein the offset adjust circuit further comprises a logical AND circuit including a first input for receiving the output signal from the first delay circuit, a second input for receiving the delayed version of the output signal from the second delay circuit, and an output for generating the modified output signal to be monitored by the controller.

21. The apparatus of claim 18, wherein the amount of delay associated with the delayed version of the output signal is scaled to the first switch delay associated with the first delay circuit.

22. The apparatus of claim 2, wherein the edge sharpener circuit comprises a latch circuit.

23. A semiconductor device including at least one apparatus for characterizing a change in delay induced by a switching history of a circuit, the at least one apparatus comprising:

a pulse generator configurable for generating a signal having a pulse width that is selectively adjustable, the signal having a first edge and a second edge associated therewith, the first and second edges being opposite in polarity with respect to one another;

a first delay circuit coupled to the pulse generator, the first delay circuit being configurable for receiving the signal from the pulse generator and generating an output signal at an output of the first delay circuit, the first delay circuit having a first switch delay characteristic of the first edge of the received signal and a second switch delay characteristic of the second edge of the received signal, wherein the pulse width of the signal generated by the pulse generator is less than the first switch delay associated with the first delay circuit; and a controller, operative to: (i) vary the pulse width of the signal generated by the pulse generator; (ii) monitor the output signal; (iii) determine a value of the pulse width that defines a boundary of when the output signal is present and when the output signal is not present; and (iv) determine a ratio of the value of the pulse width that defines the boundary to at least one of the first switch delay and the second switch delay, whereby the change in delay induced by the switching history of the circuit to be characterized is a function of the ratio.

24. The semiconductor device of claim 23, wherein the pulse generator in the at least one apparatus comprises a second delay circuit including a plurality of delay elements connected in a series chain, at least a portion of the delay elements being scaled to at least one of the first switch delay and the second switch delay associated with the first delay circuit, the second delay circuit including a plurality of feedback paths for operatively adjusting the pulse width of the signal.

25. The semiconductor device of claim 23, wherein the at least one apparatus further comprises a pulse detector coupled to the output of the first delay circuit, the pulse detector being configurable for monitoring the output signal from the first delay circuit and providing an indication of at least one of when the output signal is present at the output of the first delay circuit and when the output signal is not present at the output of the first delay circuit.

26. The semiconductor device of claim 23, wherein the at least one apparatus further comprises an offset adjust circuit operatively coupled to the output of the first delay circuit, the offset adjust circuit being configurable for modifying at least a pulse width of the output signal to be monitored by the controller by generating a delayed version of the output signal from the first delay circuit, the delayed version of the output signal having a first edge and a second edge associated therewith, the modified output signal having a first edge substantially matched to the first edge of the delayed version of the output signal and having a second edge substantially matched to the second edge of the output signal from the first delay circuit.

27. A method for characterizing a change in delay induced by a switching history of a circuit, the method comprising the steps of:

generating a first signal having a pulse width that is selectively adjustable, the first signal having a first edge and a second edge associated therewith, the first and second edges being opposite in polarity with respect to one another;

generating a second signal having a first switch delay characteristic of the first edge of the first signal and a second switch delay characteristic of the second edge of the first signal, wherein the pulse width of the first signal is less than the first switch delay associated with the second signal;

varying the pulse width of the first signal;

monitoring the second signal;

determining a value of the pulse width that defines a boundary of when the second signal is present and when the second signal is not present; and determining a ratio of the value of the pulse width that defines the boundary to at least one of the first switch delay and the second switch delay, whereby the change in delay induced by the switching history of the circuit to be characterized is a function of the ratio.

* * * * *